United States Patent
Mow et al.

(10) Patent No.: US 9,002,287 B2
(45) Date of Patent: Apr. 7, 2015

(54) SYSTEM FOR TESTING MULTI-ANTENNA DEVICES

(75) Inventors: Matt A. Mow, Los Altos, CA (US);
Robert W. Schlub, Campbell, CA (US);
Ruben Caballero, San Jose, CA (US)

(73) Assignee: Apple Inc., Cupertino, CA (US)

( * ) Notice: Subject to any disclaimer, the term of this patent is extended or adjusted under 35 U.S.C. 154(b) by 1015 days.

(21) Appl. No.: 12/577,128

(22) Filed: Oct. 9, 2009

(65) Prior Publication Data
US 2011/0084887 A1    Apr. 14, 2011

(51) Int. Cl.
*H04B 17/00*    (2006.01)
*G01R 29/10*    (2006.01)

(52) U.S. Cl.
CPC ........................................ *G01R 29/10* (2013.01)

(58) Field of Classification Search
CPC ........... H04B 17/0062; H04B 17/0007; H04B 17/002; H04B 17/0042; H04B 17/0067; H04B 17/007; H04B 17/0085; H04B 7/0608; G01C 19/00; G01R 29/10; H04W 24/06
See application file for complete search history.

(56) References Cited

U.S. PATENT DOCUMENTS

| | | | |
|---|---|---|---|
| 3,806,943 A | | 4/1974 | Holloway |
| 4,232,319 A | | 11/1980 | Fusinski |
| 4,864,315 A | | 9/1989 | Mohuchy |
| 5,134,405 A | | 7/1992 | Ishihara et al. |
| 5,530,412 A | * | 6/1996 | Goldblum ...................... 333/232 |
| 2003/0003883 A1 | * | 1/2003 | Wallace et al. ................ 455/115 |
| 2006/0055592 A1 | * | 3/2006 | Leather et al. ................. 342/174 |
| 2006/0057985 A1 | * | 3/2006 | Woo et al. ....................... 455/147 |
| 2006/0194553 A1 | * | 8/2006 | Ozaki et al. ................. 455/226.1 |
| 2006/0229018 A1 | * | 10/2006 | Mlinarsky et al. .......... 455/67.11 |
| 2007/0243826 A1 | | 10/2007 | Liu |
| 2008/0056340 A1 | * | 3/2008 | Foegelle ........................ 375/224 |
| 2008/0129615 A1 | * | 6/2008 | Breit et al. .................... 343/703 |
| 2008/0305754 A1 | * | 12/2008 | Foegelle ..................... 455/115.1 |
| 2010/0231232 A1 | * | 9/2010 | Jackson et al. ................ 324/612 |
| 2011/0299570 A1 | | 12/2011 | Reed |
| 2012/0071107 A1 | * | 3/2012 | Falck et al. ................. 455/67.12 |

OTHER PUBLICATIONS

Reed, "Summary of the Channel Emulator based MIMO OTA Method," Oct. 1, 2009.
Kolu, "Summary of the anechoic chamber and fading emulator based MIMO OTA solution," Elektrobit Corporation, Oct. 1, 2009.

(Continued)

*Primary Examiner* — Zhiyu Lu
(74) *Attorney, Agent, or Firm* — Treyz Law Group; Jason Tsai; Joseph Guihan

(57) ABSTRACT

A test system for testing multiple-input and multiple-output (MIMO) systems is provided. The test system may convey signals bidirectionally between two test chambers. Each test chamber may be lined with foam to minimize electromagnetic reflections. Each test chamber may include structure three-dimensional array of test antennas. The test antennas may be mounted in a sphere using an antenna mounting structure. The antenna mounting structure may include multiple rings of different sizes. Test antennas may be embedded in the inner walls of the antenna mounting structure. There may be multiple receiving antennas located in each test chamber. One test chamber may include a device under test inside an array of test antennas and another test chamber may include base station antennas inside another array of test antennas. Signals may be conveyed between the test chambers using channel emulators.

20 Claims, 12 Drawing Sheets

(56) References Cited

OTHER PUBLICATIONS

Jamsa, "Proposal for common approach on MIMO OTA," Elektrobit Corporation, Oct. 1, 2009.

Yamamoto, "Handset MIMO antenna measurement using a Spatial Fading Emulator," Oct. 1, 2009.

* cited by examiner

SYSTEM FOR TESTING MULTI-ANTENNA DEVICES

BACKGROUND

This invention relates to testing devices with antennas, and more particularly, to testing multi-antenna devices.

Electronic devices such as handheld electronic devices, portable electronic devices, and computers often have wireless communication capabilities. Electronic devices with wireless communication capabilities typically include antennas. Antennas transmit and receive radio frequency (RF) signals.

It may be desirable to incorporate more than one antenna in a single electronic device. Electronic devices with more than one antenna may sometimes be referred to as multi-antenna devices. Multi-antenna devices may exhibit improved performance over single-antenna devices. The performance improvement provided by multi-antenna devices may depend on factors such as multipath propagation, spatial correlation of the wireless signals, delay/frequency spread of the wireless signals, etc. It may be desirable to optimize multi-antenna devices while taking into account the various factors that affect device performance.

In order to optimize the design of multi-antenna devices, it may be useful to test a wireless communications system in which data is sent back and forth between a first device and a second device. The first and second devices may each have more than one antenna. Wireless signals that travel back and forth between the first and second devices may travel through a channel whose properties are affected by the presence of obstacles, reflective materials, and other environmental factors.

For example, imagine a scenario in which a cellular telephone is communicating wirelessly with a base station. The wireless communications channel in this type of scenario will be influenced by physical variations in terrain between the cellular telephone and the cell tower such as the presence of buildings, moving cars, mountains, regions of water, etc.

Efforts have been made to simulate communications systems using software. In software simulations, the behavior of communications devices and the wireless channel are handled using software abstractions. Software simulations are not necessarily accurate models of the actual characteristics of a channel and the interactions between the communicating devices and the channel.

To address the shortcomings of software simulations, efforts have also been made to simulate a communications system using channel emulator hardware. In a typical test arrangement, a first device may have a first RF front end disconnected from the antenna of the first device. The first RF front end may be connected to an input of a channel emulator. A second device may have a second RF front end that is disconnected from the antenna of the second device. The second RF front end may be connected to an output of the channel emulator. The channel emulator attempts to recreate the characteristics of a real-life channel (e.g., multipath gain, multipath delay, etc.). The channel emulator may send information unidirectionally from the first device to the second device during testing. Because this setup allows for unidirectional communications, it is generally not possible to fully take into account the interaction between the antennas of the first and second devices. Moreover, because the channel emulator makes simplifying assumptions about the behavior of a typical channel, the channel emulator will not be able to effectively model how the antennas behave within the device housing, how polarization and gain effects impact antenna performance, or how devices with multiple antennas operate.

It would therefore be desirable to be able to provide improved ways to test wireless communications performance for devices with antennas.

SUMMARY

A test system is provided for wireless testing of electronic devices. The electronic devices may have multiple antennas. A multi-antenna device that is being tested may be referred to as a device under test (DUT). The DUT may be placed within an antenna testing chamber structure. The antenna testing structure may be spherical, may be based on a cube, etc.

The walls of the antenna testing chamber may be lined with RF-absorbent material (e.g., a rubberized pyramid-shaped foam) that minimizes reflections of wireless signals. Over-the-air (OTA) antennas (sometimes referred to as test antennas) may be embedded in the inner walls of the antenna structure. The OTA antennas may be horn antennas or other suitable types of antennas. The OTA antennas may generate a spherical feasibility region in which the DUT is tested. The feasibility region represents the portion of the testing chamber that has a desired radiation pattern. The feasibility region may have a diameter of at least 1 meter (as an example). The antenna testing chamber may have a diameter that is greater than the diameter of the feasibility region.

The OTA antennas may be embedded in the foam on the chamber walls or may be mounted on movable antenna mounting structures within the chamber (as examples). The OTA antenna may be mounted on rings or other antenna structures that hold the OTA antennas in a desired array pattern surrounding the DUT. The array pattern may, for example, be a substantially three-dimensional pattern that surrounds the DUT in three dimensions. Multiple receiving antennas may be provided within the test chamber. The receiving antennas may, for example, be located outside of the OTA antenna structure. The receiving antennas may be horn antennas or other suitable types of antenna.

The test chamber may have an input that receives incoming signals. The incoming signals may be fed to each of the OTA antennas. By controlling the radio-frequency signals that are provided to the three-dimensional array of OTA antennas, tests may be performed in which the incoming test signal is directed at the DUT from any desired angle (e.g., to perform radial 360° sweeps, to perform off-axis tests from above or below the DUT, etc.). As these tests are performed, the DUT can attempt to receive and process the test signal. In DUTs that have multiple antennas, protocol-compliant tests can be performed while simultaneously exercising all of the antennas in the DUT.

During testing, the DUT may transmit wireless signals. These signals may be received by the receiving antennas in the test chamber. The test chamber may have an output. Signals from the receiving antennas may be routed to the output.

Two test chambers may be used in a test system. The DUT may be placed in a first of the test chambers. Additional equipment that is to be tested in combination with the DUT may be placed in a second of the test chambers. The additional equipment may be, for example, an access point or wireless base station of the type that normally communicates with the DUT. The access point or wireless base station may include multiple antennas.

With this type of test system configuration, the first test chamber may have a DUT at its center. The DUT may be rotated or fixed during testing. The second test chamber may contain the base transceiver station (or access point) at its center. The first chamber may have an output that is coupled to a first channel input of a first channel emulator. The first channel emulator may provide a first channel output that is connected to an input of the second test chamber. Likewise, the second chamber may have an output that is fed to a second channel input of a second channel emulator. The second channel emulator may provide a second channel output that is connected to an input of the first test chamber. The first and second channel emulators may accurately recreate the behaviors of a real life channel. The first and second channel emulators may be controlled by a control unit to adjust the properties of the signals that are traveling through the channel emulators.

A test system of this type may support bidirectional multiple-input and multiple-output (MIMO) OTA testing. The test system can be used to accurately test wireless performance in the presence of effects such as multipath propagation, interference, handover mechanisms, power control, delay and frequency spread of wireless signals, etc.

The DUT may be connected to vector network analyzers (VNA). The VNAs may be used to measure performance parameters (e.g., gain, compression characteristics, saturated power, efficiency, linearity, etc.) of the multi-antenna DUT. The antenna design of the DUT may be optimized based on these measured performance parameters.

The test system may be used to test a variety of typical operating scenarios. The test system may, for example, be used in testing various types of cellular networks, wireless local area networks (WLAN), communications systems that use various modulation and multiplexing techniques (e.g., frequency modulation, time-division-multiplexing, etc.), other system configurations (e.g., multiple-input-multiple-output (MIMO) configurations, single-input-multiple-output (SIMO) configurations, multiple-input and single-output (MISO) configurations, and single-input-single-output (SISO) configurations, etc.). Tests may also be performed on configurations that include multiple access points, multiple DUTs, etc.

Further features of the test system, its nature and various advantages will be more apparent from the accompanying drawings and the following detailed description.

DETAILED DESCRIPTION

Figure 1:
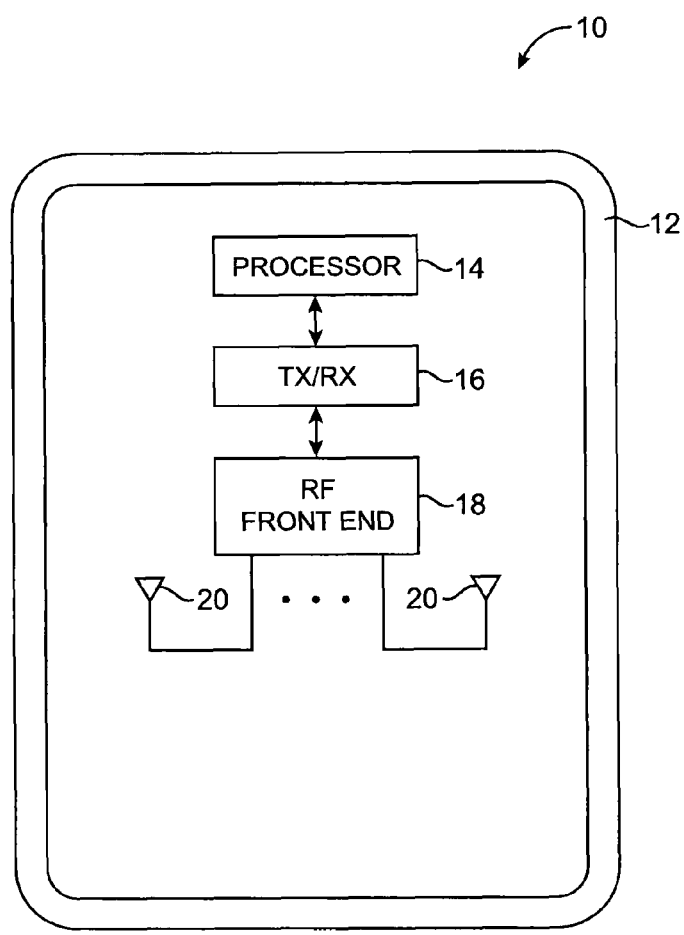
FIG. 1 is a diagram showing an illustrative multi-antenna device that may be used as a device under test (DUT) when performing wireless testing in a test system in accordance with an embodiment of the present invention.

This relates to test systems for wireless testing of electronic equipment. The test systems may, for example, be used to test electronic devices with multiple antennas. Electronic devices such as handheld electronic devices, portable electronic devices, computers, and other multimedia electronic devices may include antennas such as patch antennas, planar inverted-F antennas, slot antennas, etc. To enhance wireless performance, it may be desirable for a device to use multiple antennas. By using multiple antennas simultaneously, capacity can be enhanced. Such multiple-antenna equipment can, however, pose testing challenges. Multiple antenna systems typically operate by exploiting the multiple paths between transmitters and receivers. These multiple paths may, for example, involve radio-frequency signals that are received at a device from widely divergent angles. Some paths may, for example, involve almost direct, line-of-sight communications between transmitter and receiver. Other paths may involve reflections off of intervening objects and may arrive at a receiver from a much different angle. To properly test a device that has multiple antennas, it may therefore be desirable to use the test system to replicate complex three-dimensional operating environments. For example, it may be desirable to use the test system to create radio-frequency signal beams that can be directed at a device under test from a desired arbitrary angle or combination of angles in three-dimensional space.

Antennas are components that are designed to transmit or receive electromagnetic waves such as radio frequency (RF) waves. Electronic devices with antennas may transmit or receive RF signals wirelessly.

A single electronic device such as a portable handheld electronic device may have more than one antenna. A multi-antenna device may exhibit performance improvements over a single-antenna device. For example, in comparison to a single-antenna device, a multi-antenna device may have a higher antenna gain and/or increased capacity. It may therefore be desirable to use multi-antenna devices in a communications system. A communications system in which multiple antennas are used at both the transmitting device and the receiving device may sometimes be referred to as a multiple-input and multiple-output (MIMO) system or a multiple antenna system (MAS).

It may be desirable to optimize a multi-antenna device for use in a MIMO system. Consider a first (simplified) scenario in which a first single-antenna device is communicating wirelessly with a second single-antenna device. The first single-antenna device may be a user's cellular telephone. The second single-antenna device may be a cellular telephone base station. The first single-antenna device may attempt to transmit a packet of data to the second single-antenna device. The transmitted data may be in the form of wireless signals (e.g., RF signals). The wireless signals may travel through air. The wireless signals may also make contact with intervening objects that exist between the first and second single-antenna devices. The wireless signals may therefore be deflected or reflected off the surfaces of the intervening objects. The intervening objects may include buildings, moving cars, bodies of water, mountains, the ionosphere, animals, or any other entity that may exist between the first and second single-antenna devices.

In a typical scenario, the wireless signals that are transmitted by the cellular telephone will not all take the same path to the cellular base station. For example, the wireless signals may each be deflected or reflected off the surfaces of different intervening objects at different angles. Different portions of the wireless signals may therefore reach the receiving antenna through different paths. The phenomenon in which radio signals arrive at a receiving antenna over two or more distinct paths is sometimes referred to as multipath propagation.

The collective medium through which the wireless signals may travel between the two wireless devices may be referred to as the channel of the wireless communications system. Accurate modeling of a wireless communications channel in an environment where multipath propagation is present can be fairly complex, because the channel is a time-dependent entity (e.g., the characteristic of the channel may constantly be evolving in time) and should take into account all possible intervening objects and different possible paths that may be taken by the wireless signals. Despite these difficulties, software simulations and channel emulation hardware can often be used to satisfactorily test single-antenna equipment if appropriate simplifying assumptions are made.

Wireless tests on multi-antenna equipment cannot, however, always be tested using conventional test systems. Consider, as an example, a second scenario in which a first multi-antenna device is communicating with a second multi-antenna device (i.e., MIMO system). The wireless signals transmitted in the second scenario may likewise be sent through a channel. This second scenario will generally be much more complex than the first scenario because the behavior of each of the multiple antennas may interact and interfere with one another. Wireless tests performed on the first and second antennas in isolation cannot simply be superimposed to determine the wireless performance of the antennas when operating together. This is because the behavior of one antenna on a receiving device will typically affect the behavior of another antenna on the receiving device. It is therefore difficult or impossible to realistically simulate a MIMO scenario exclusively in software.

It may therefore be desirable to test the MIMO configuration using an approach that utilizes actual hardware. Conventional hardware testing involves connecting a base station to a test device through a channel emulator. The channel emulator is a type of "black box" that can emulate the behavior of a real-life channel. The base station and the test device may each have an RF front end and an antenna. The RF front end of the base station is directly routed to the channel emulator. The RF front end of the test device is directly connected to the channel emulator. The antennas of the base station and/or the test device are effectively decoupled from the test system, because the antennas are not connected to the RF front ends and are not involved in transmission or retrieval of the wireless signals. Testing a wireless communications system in this way may not fully take into account the interaction of the antennas with the channel, the interaction of the antennas with other components in the wireless device, the interference and noise associated with the multiple antennas, etc.

A controlled test environment that can accurately emulate actual wireless communication (e.g., in a MIMO system) and that can take into account the behavior of the multiple antennas may be used to enhance test performance. A device under test (DUT) may be placed in the controlled test environment. The DUT may be a multi-antenna device. The antenna design of the DUT may be varied to explore the impact of design variations. For example, the number of antennas, the distance between antennas, the orientation of the antennas, and the polarization of the antennas may be adjusted. Tests can be performed for each test configuration. Each of the multiple antennas in the tested equipment may be active, allowing protocol-compliant tests to be performed. Using this approach, an antenna designer can investigate the effects/tradeoffs of such adjustments to produce an optimized antenna design for a wireless communications system.

FIG. 1 shows an example of a test device such as device under test (DUT) 10. DUT 10 may be a handheld electronic device, a portable electronic device, a computer, a multimedia device, or any other electronic equipment. DUT 10 may have a device housing such as housing 12 that forms a case for its associating components.

DUT 10 may have a processor such as processor 14. Processor 14 may be used in controlling the operation of DUT 10. Processor 14 may include one or more processing circuits. Examples of circuits that may be used in implementing processor 14 include microprocessors, baseband processors, digital signal processors, microcontrollers, application-specific integrated circuits, etc.

Processor 14 may interact with a transceiver circuit such as transceiver block 16. Transceiver block 16 may include an analog-to-digital converter (ADC), a digital-to-analog converter (DAC), a digital down converter (DDC), and a digital up converter (DUC). In a scenario in which DUT 10 is transmitting, processor 14 may provide digital data (e.g., baseband signals) to the DUC. The DUC may convert or modulate the baseband digital signals to an intermediate frequency (IF). The IF digital signals may be fed to the DAC to convert the IF digital signals to IF analog signals. The IF analog signals may then be fed to an RF front end such as RF front end 18.

In another scenario in which DUT 10 is receiving wireless signals, RF front end 18 may provide incoming IF analog signals to the ADC. The ADC may convert the incoming IF analog signals to incoming IF digital signals. The incoming IF digital signals may then be fed to the DDC. The DDC may convert the incoming IF digital signals to incoming baseband digital signals. The incoming baseband digital signals may then be provided to processor 14 for further processing. Transceiver block 16 may either up-convert baseband signals to IF signals or down-convert IF signals to baseband signals. Transceiver block 16 may therefore sometimes be referred to as an IF stage.

RF front end 18 may include circuitry that couples transceiver block 16 to device antennas such as antennas 20. RF front end 18 may include circuitry such as matching circuits, band-pass filters, mixers, a low noise amplifier (LNA), a power amplifier (PA), etc. In the scenario in which DUT 10 is transmitting, RF front end 18 may up-convert the IF analog signals from transceiver block 16 to RF analog signals (e.g., the RF signals typically have higher frequencies than the IF signals). The RF analog signals may be fed to antennas 20 and may be broadcasted.

In the another scenario in which DUT 10 is receiving wireless signals, antennas 20 may receive incoming RF analog signals from a broadcasting device such as a base transceiver station, access point, etc. The incoming RF analog signals may be fed to RF front end 18. RF front end 18 may down-convert the incoming RF analog signals to IF analog signals. The IF analog signals may then be fed to transceiver block 16 for further data processing.

Processor 14, transceiver block 16, RF front end 18, and antennas 20 may be housed within housing 12. As shown in FIG. 1, there may be more than one antenna 20 within housing 12. The number, position, orientation, polarization, and gain of the antennas may be adjusted for optimal performance of DUT 10 in a MIMO test system. Comprehensive testing may require the ability to operate all of the antennas in DUT 10 while using the test system to produce radio-frequency test signals with a wide range of possible orientation angles, beam divergences, etc. To ensure that these tests are exhaustive, it may be desirable to use a two-dimensional or three-dimensional array of OTA antennas in the test chamber. A two-dimensional array of test antennas can be used in the test system to recreate test signals that approach the DUT from any desired angle in a horizontal test plane (i.e., at any angle from 0-360°), whereas a three-dimensional antenna array can be used to sweep the test beam out of the horizontal plane.

Figure 2:
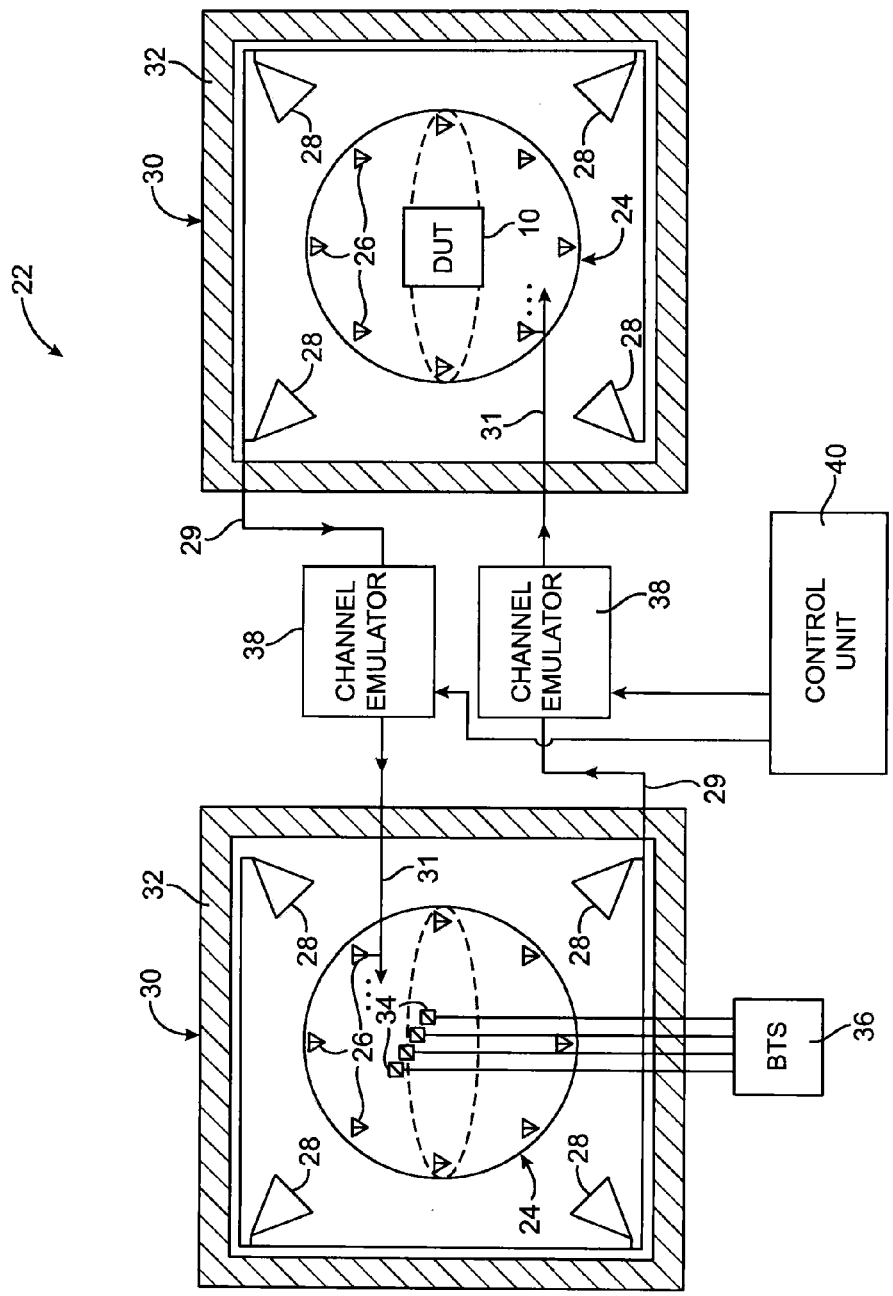
FIG. 2 is a diagram showing an illustrative system that can be used for bidirectional testing of wireless equipment such as multi-antenna devices in accordance with an embodiment of the present invention.

An illustrative test system that may include test chambers with three-dimensional arrays of test antennas is shown in FIG. 2. Test system 22 of FIG. 2 may be a MIMO system in which the two devices that are being tested each have multiple antennas.

DUT 10 may be surrounded by a three-dimensional antenna mounting structure such as spherical antenna mounting structure 24. DUT 10 may be placed at the center of spherical antenna mounting structure 24. Antenna mounting structure 24 may provide support for an array of over-the-air (OTA) antennas such as OTA antennas 26. OTA antennas 26 may, for example, be attached to the surfaces of antenna mounting structure 24. OTA antennas 26 may be implemented using horn antennas or other suitable types of antennas. Each horn antenna may, for example, produce a wedge of radio-frequency signals towards DUT 10. By incorporating a sufficient number of OTA antennas 26 into system 22 and by controlling the phase, amplitude, and frequency of the radio-frequency signals, the array of OTA antennas 26 may be used to produce a desired beam shape. In a typical configuration, antenna structure 24 may have 64 OTA antennas 26. If desired, more than 64 or fewer than 64 OTA antennas 26 may be used (e.g., there may be more than 10 test antennas 26, more than 20 test antennas 26, more than 50 test antennas 26, etc.).

OTA antennas 26 form a phased antenna array. In a phased array, the relative phases and amplitudes of the respective wireless signals feeding the antennas are controlled so as to produce a desired radiation pattern. For example, in system 22, radio-frequency circuitry such as circuitry based on a control unit and one or more channel emulators or other suitable radio-frequency signal generation and processing circuitry may be used in performing tests with an array of OTA antennas.

In particular, circuitry such as control unit 40 and channel emulators 38 of FIG. 2 may be used to control the phase, amplitude, and frequency of the radio-frequency signals that feed antennas 26, thereby controlling the beam shapes associated with the antenna arrays.

Antenna mounting structure 24 may have a diameter of 3 meters (m) or more or a diameter that is greater than 1 m (as examples). Antenna mounting structure 24 and its associated antennas 26 (e.g., a structure that behaves like a phased array) may create a sufficiently large DUT feasibility region for testing potentially bulky devices such as computer monitors with built in antennas, televisions with antennas, desktop and laptop computers with antennas, etc. The feasibility region is a region with a desired pattern of electromagnetic fields. The fields in the feasibility region are preferably sufficiently well controlled to allow accurate modeling of real life over-the-air antenna signal behaviors. Field uniformity may be enhanced by using a sufficient number of OTA antennas (e.g., 64) and by using a sufficiently large diameter for the antenna mounting structure (e.g., 7 m). The feasibility region may have a diameter of 1 m (for example). DUT 10 may be placed within the feasibility region during system testing.

Antenna mounting structure 24 and its associated antennas 26 may be used to create radio-frequency signal beams that are varied over all possible angle values in azimuth and elevation (i.e., antennas 26 may accurately replicate desired electric field characteristics in three dimensions). Antennas 26 may also accurately replicate spatial correlation due to angular spread (a measure of how correlated fields are at separate locations in the feasibility region). Using antennas 26, system 22 may also accurately replicate signal delay spread (e.g., each RF signal may have a different phase delay for frequency diversity) and frequency spread effects (e.g., each RF signal may have a different period for time diversity). The amount and variation of delay and frequency of the wireless signals may be based on a statistical (e.g., Gaussian) distribution, as an example.

Antenna mounting structure 24 may be placed in a first test chamber such as test chamber 30. Test chamber 30 may have support structures that suspend antenna mounting structure 24 and antennas 26 in the center of the chamber. Test chamber 30 may have a cubic structure (six square walls) or a rectangular prism-like structure (six rectangular walls), if desired. Test chamber 30 may be internally lined by absorbent material such as radiation absorbent material 32. Absorbent material 32 may be formed from pyramid-shaped foams or other suitably lossy material. Test chamber 30 may sometimes be referred to as an anechoic chamber.

There may be receiving antennas such as receiving antennas 28 that are located at the corners of test chamber 30. In a scenario in which test chamber 30 has a cubic structure with 8 corners, 8 receiving antennas 28 may be located at the respective corners. This is merely an example. In general, any number of receiving antennas 28 may be used at any location within test chamber 30. Receiving antennas 28 may be horn antennas or antennas of other types.

There may be a second test chamber (shown as test chamber 30 on the left-hand side of FIG. 2) in system 22 that provides signals from a base station such as base transceiver station (BTS) 36. Base transceiver station 36 may sometimes be referred to as an access point or multi-antenna wireless equipment. BTS 36 may have base station antennas such as base station antennas 34 (sometimes referred to as wireless equipment antennas). Base station antennas 34 may be placed in the center of antenna structure 24 that is located in the second test chamber. FIG. 2 shows four base station antennas 34. This is merely illustrative. Equipment with any suitable number of antennas 34 may be tested if desired.

The first and second test chambers 30 may send signals back and forth through channel emulators such as channel emulator 38. Channel emulators 38 may be used to help accurately model a real life channel (e.g., by emulating the effects of multipath propagation, variable delays for each path, etc.).

Receiving antennas 28 in the second test chamber may receive wireless signals from base station antennas 34. Receiving antennas 28 in the second test chamber may be coupled to an appropriate channel emulator 38 using radio-frequency path 29. Signal path 29 may, for example, be fed to an input of a first channel emulator 38. This first channel emulator 38 may have an output such as output path 31. Output line 31 may contain individual paths (e.g., cables). Each cable or other path may be connected between a respective one of the OTA antennas and a corresponding port on channel emulator 38. Channel emulator 38 may have any suitable number of inputs and outputs (ports). Using that paths that are connected to the channel emulator ports, the channel emulator may be connected to each of the OTA antennas in the first test chamber. The OTA antennas in the first chamber may transmit the RF signals sent by BTS 36 to DUT 10.

RF signals may likewise be transmitted from DUT 10 to BTS 36 during testing (e.g., from the first test chamber to the second test chamber). Receiving antennas 28 at the first test chamber may receive RF signals broadcasted from DUT 10. Receiving antennas 28 at the first test chamber may be connected together by signal path (line) 29. Signal line 29 may be fed to an input of second channel emulator 38. Second channel emulator 38 may have an output such as output path (line) 31. Output line 31 may be connected to each of the OTA antennas in the second test chamber. The OTA antennas in the second chamber may transmit the RF signals sent by DUT 10 to the base station antennas.

Using an arrangement of the type illustrated in FIG. 2, test system 22 may have bidirectional MIMO capabilities. The system of FIG. 2 includes two emulators that are capable of sending wireless signals in both directions between two multi-antenna devices.

First and second channel emulators 38 may each be controlled by a control unit such as control unit 40. Control unit 40 and/or channel emulators 38 may control the frequency, phase, and amplitude of the radio-frequency signals that are transmitted by OTA antennas 26 into the test chamber. These radio-frequency signal adjustments may be made in real time using the software and/or hardware resources of control unit 40, channel emulators 38, or other suitable control equipment. For example, radio-frequency signal adjustments may be performed using tuning circuits (e.g., impedance tuners, amplitude shifters, phase shifters, etc.). With one suitable arrangement, each OTA antenna may be provided with a respective phase and amplitude controller. Control unit 40 may control the channel emulators and other hardware of system 22 to tune the respective phased arrays (e.g., the collection of OTA antennas 26) and to provide desired characteristics for the feasibility region (e.g., to control beam direction, beam spread, etc.).

If desired, receiving antennas 28 may not be used. In a scenario in which receiving antennas 28 are not used in a test chamber, OTA antennas 26 that are attached to the surfaces of antenna mounting structure 24 may be used to transmit and receive wireless signals. OTA antennas 26 configured to receive wireless signals in this way may have receive paths that are combined to form signal path (line) 29. Signal line 29 may be fed to an input of channel emulator 38. Receiving antennas 28 may be omitted from one or both test chambers in test system 22, if desired.

Figure 3:
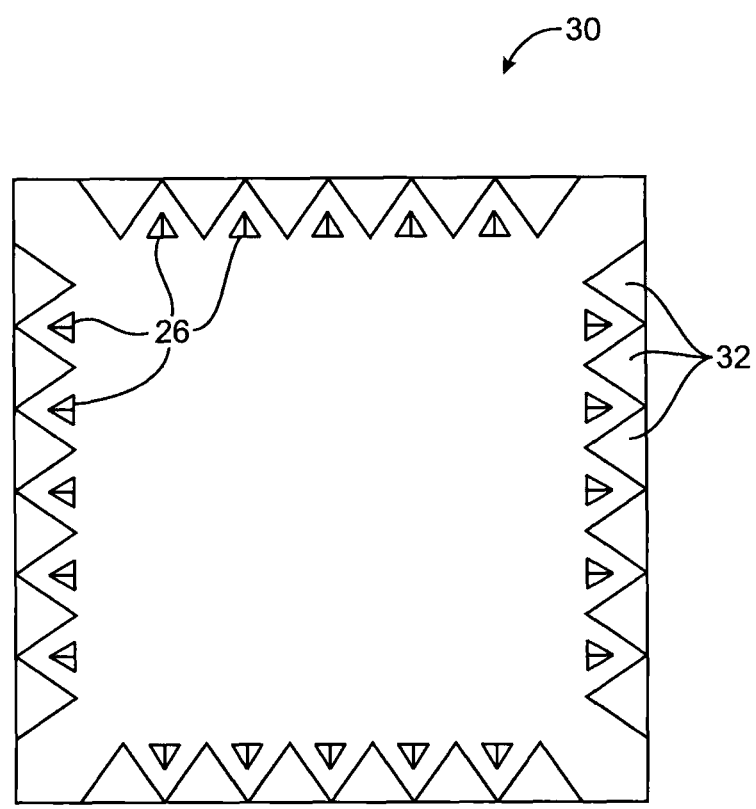
FIG. 3 is a cross-sectional top view of an illustrative test chamber with over-the-air antennas embedded in the chamber walls in accordance with an embodiment of the present invention.

The OTA antennas of test system 22 may not only be attached to the spherical antenna mounting structure. As shown in FIG. 3, OTA antennas 26 may, for example, be embedded in absorbers 32 on planar test chamber walls. A test chamber arranged in this way need not use additional support structures to support the antenna structure described in connection with FIG. 2. OTA antennas 26 embedded along the chamber walls in this way may be tuned to create a spherical feasibility region that has a diameter of 1 m, as an example.

Figure 4:
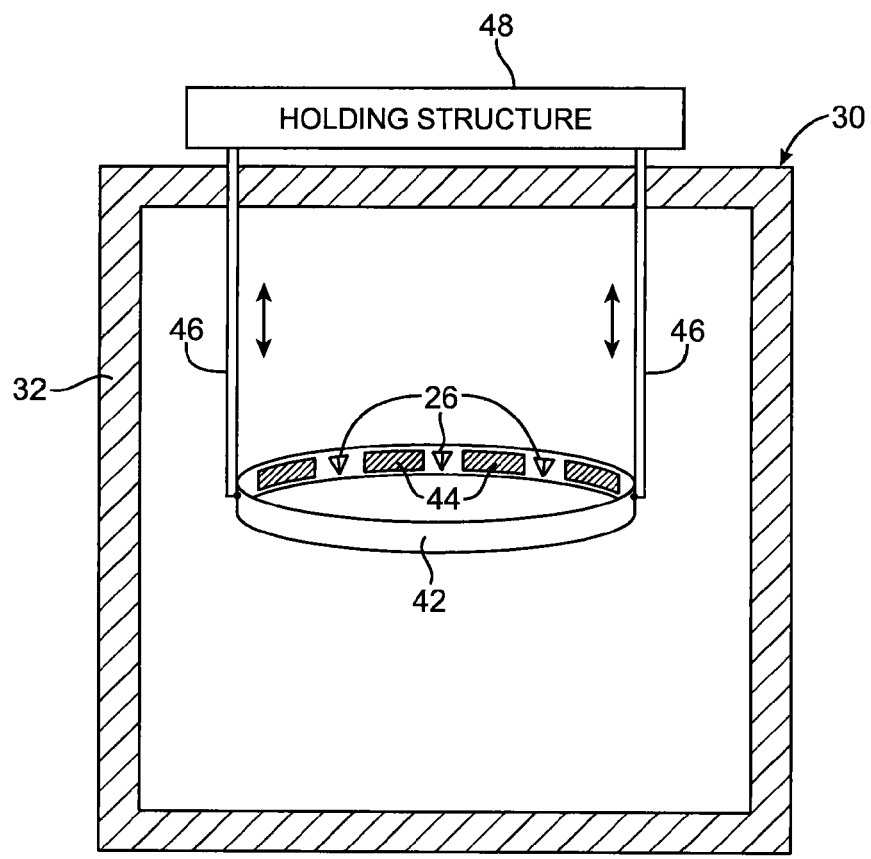
FIG. 4 is a diagram showing an illustrative ring-shaped antenna mounting structure that may be used to support an array of over-the-air (OTA) antennas in a test chamber in accordance with an embodiment of the present invention.

If desired, antenna mounting structure 24 may have a ring shape or other suitable planar two-dimensional shape (e.g., a rectangular mounting structure shape on which a rectangular array of OTA antennas may be mounted, an oval mounting structure shape on which an oval array of OTA antennas may be mounted, a triangular mounting structure shape on which a triangular array of OTA antennas may be mounted). The OTA antennas may be attached to the ring-shaped antenna mounting structure to form a circular antenna array. For example, OTA antennas 26 may be supported using ring-shaped antenna mounting structure 42 of FIG. 4. The inner wall of ring antenna mounting structure 42 may be lined by absorbers 44. OTA antennas 26 may be embedded in absorbers 44. Absorbers 44 may minimize reflections. If desired, the outer wall of ring-shaped antenna mounting structure 42 may also be lined with absorbers 44 to minimize reflections. Ring-shaped antenna mounting structure 42 may be suspended in the center of test chamber 30 by one or more support structures such as support structures 46.

Support structures 46 may be attached to a holding structure such as holding structure 48. Holding structure 48 may include motorized equipment that moves structures 46 and thereby moves antenna mounting structure 42 and its OTA antennas 26. For example, holding structure 48 may have mechanical devices (e.g., motors, pulleys, gears, etc.) that can be used to raise or lower the position of the ring-shaped antenna mounting structure within test chamber 30. Ring-shaped antenna structure 42 may, for example, be raised or lowered to maximum separation between OTA antennas 26 and absorber walls in the chamber, to adjust the location of the feasibility region, to temporarily stow antennas 26 out of the way when performing housekeeping operations in the chamber or when mounting DUT 10 within the chamber, etc. Holding structure 48 may be placed above ring-shaped antenna mounting structure 42 or may be mounted in other suitable locations. Holding structure 48 may, for example, be located below the ring-shaped antenna mounting structure and may have retractable support structures 46 that buttress the ring antenna structure from below.

Support structures 46 may be formed from cables, collapsing hinged members (e.g., in an accordion shape), rigid hinged members, hollow tubes, or other suitable structures. It may be desirable to form some or all of support structures 46 from dielectric materials to ensure radio-frequency transparency. Output lines 31 (e.g., coaxial cables coupled to channel emulators 38) may run through the hollow cores of support structures 46. Output lines 31 may be routed to the feeds of each of the OTA antennas embedded in ring-shaped antenna mounting structure 42.

Figure 5:
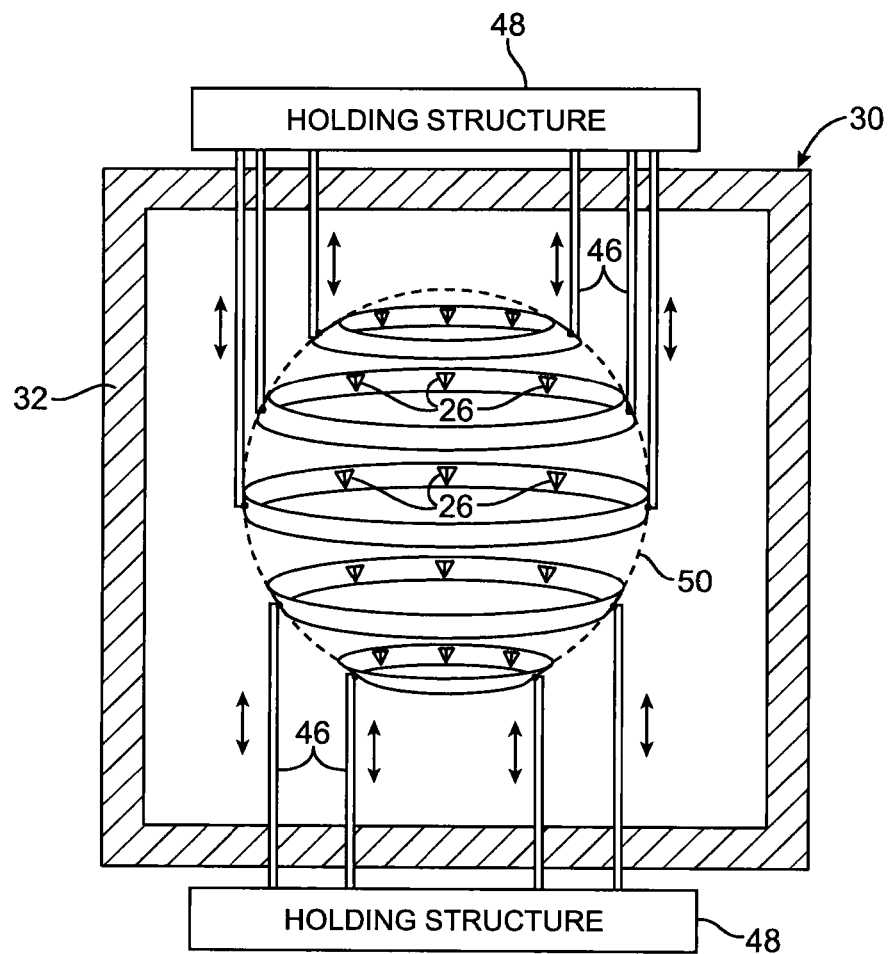
FIG. 5 is a diagram showing an illustrative spherical antenna array structure in a test chamber in accordance with an embodiment of the present invention.

More than one ring-shaped antenna mounting structure may be used in test chamber 30 (e.g., to provide three-dimensional coverage by OTA antennas 26). As shown in FIG. 5, multiple ring-shaped antenna mounting structures of varying sizes may be used to form a spherical antenna mounting structure such as spherical antenna mounting structure 50. Each of the multiple ring-shaped antenna mounting structures in antenna mounting structure 50 may be lined by absorbers. OTA antennas 26 may be embedded in the absorbers.

Antenna mounting structure 50 may be used to perform three-dimensional tests, as described in connection with spherical antenna mounting structure 24 of FIG. 2. Antenna structure 50 may have a diameter of 7 m or more, a diameter that is greater than 1 m, or other suitable size. Antenna mounting structure 50 may generate a feasibility region that has a diameter of 1 m (as an example).

Antenna mounting structure 50 of FIG. 5 may be supported by support structures 46. As shown in FIG. 5, some support structures 46 may extend downwards from an upper holding structure (e.g., holding structure 48) and some support structures may extend upwards from a lower holding structure. If desired, antenna structure 50 may be lowered into place in the test chamber using only an upper holding structure (e.g., the position of each of the multiple ring structures in antenna structure 50 may be adjusted by using motors in the upper holding structure). If desired, antenna structure 50 may be raised into position using only a lower holding structure (e.g., using motors or other positioning equipment that is controlled by control unit 40). In this type of configuration, each of the multiple ring-shaped antenna mounting structures in antenna structure 50 can be supported by the lower holding structure. Both upper and lower sets of motors or other positioning equipment may be used to adjust the positions of antennas 26 if desired. Arrangements in which antenna positioning equipment is located to the side of antennas 26 may also be used.

Antenna structure 50 may be retracted (e.g., using a nested telescope-type arrangement) when not in use or when it is desired to allow for placement of a DUT at the center of test chamber 30. Lines 31 may be routed through holding structures 46 to provide each OTA antenna 26 with appropriate wireless signals for transmission.

Figure 6:
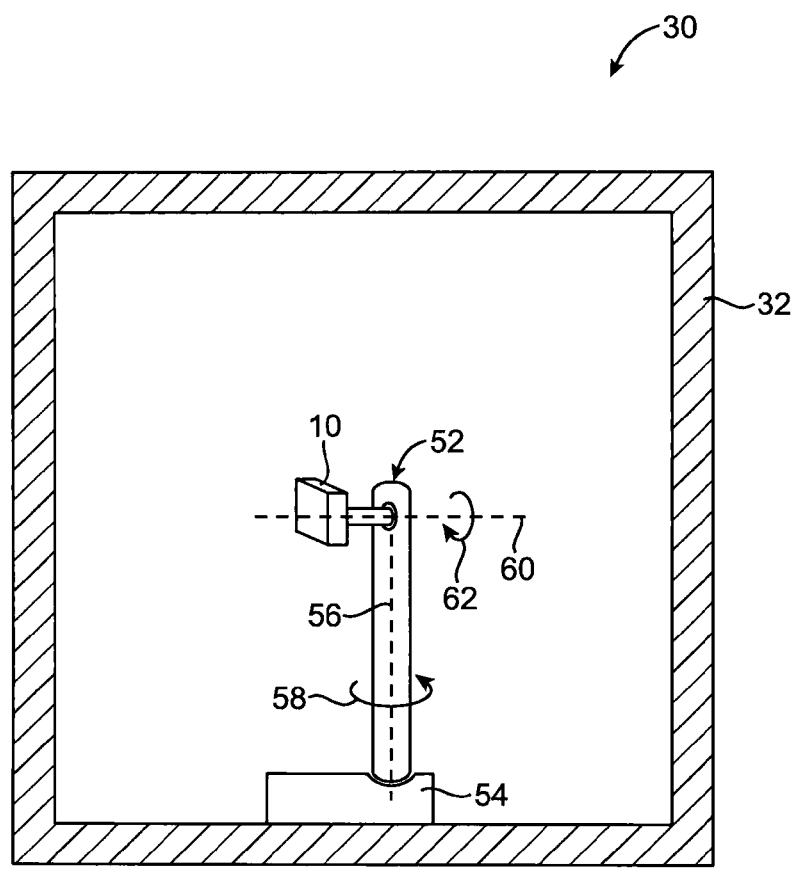
FIG. 6 is a diagram showing an illustrative rotatable structure that may be used to hold and manipulate the position of a device under test within a test chamber in accordance with an embodiment of the present invention.

The device under test (DUT 10) described in connection with FIG. 2 may be mounted on a movable support and therefore may not have a fixed orientation within test chamber 30. As shown in FIG. 6, DUT 10 may be rotated in multiple directions. DUT 10 may, for example, be attached to a DUT support structure such as rod 52. Rod 52 may be connected to a movable base structure such as base 54. Using a motor or other positioning equipment at the upper end of rod 52, DUT 10 may be rotated about rotational axis 60 in the direction of arrow 62. Rod 52 may also be rotated about rotational axis 56 in the direction of arrow 58 by a motor or other positioning equipment in base 54. Rotating DUT 10 in this way may allow test system 22 to gather data for a variety of desired beam angles. In configurations in which test system 22 has a three-dimensional array of antennas, beam movements may be implemented by adjusting the phase antenna array, rather than moving DUT 10 relative to the test chamber. DUT 10 may therefore be fixed in place (e.g., so there is no rotational or translational movement during testing).

The testing system described in connection with FIG. 2 may be used to test communications performance for configurations involving multiple users or multiple base transceiver stations (or network access points). In a scenario in which there are multiple base stations transmitting RF signals, handover performance be tested.

Figure 7:
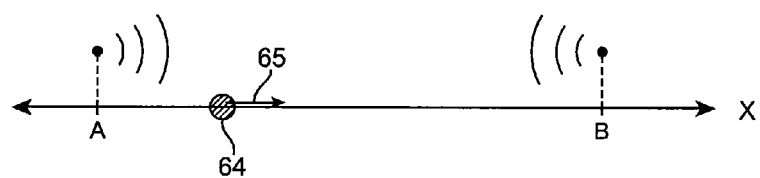
FIG. 7 is a diagram illustrating how a wireless device may move out of range of one wireless station and into range of another wireless station during use of the wireless device in accordance with an embodiment of the present invention.
Figure 8:
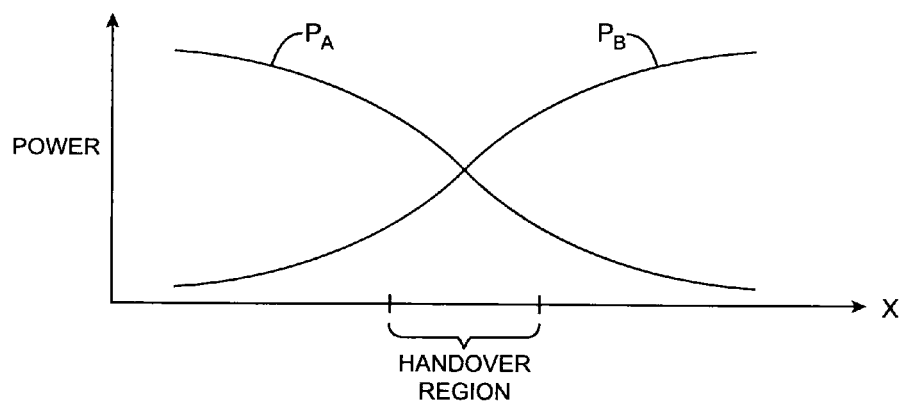
FIG. 8 is a plot illustrating a how wireless signal powers may evolve when a device under tests passes through a handover region in accordance with an embodiment of the present invention.

As shown in FIG. 7, a user at device 64 may communicate with wireless stations A and B (e.g., cellular telephone towers). When a user moves in the direction shown by arrow 65 of FIG. 7, the strength of the wireless signals that are exchanged with station A will decrease and the strength of the wireless signals that are exchanged with station B will increase. As shown in FIG. 8, when the power of the signals associated with station A (power PA) decreases sufficiently relative to the power of the signals associated with station B (power PB), a handoff procedure is used. During the handoff, device 64 begins communicating with station B instead of station A. In a typical cellular telephone environment, a user may frequently pass between the boundaries between the "cells" of the system. By using test system 22 (FIG. 2), the performance of the DUT and base station when the DUT is passing through a handover region may be evaluated.

As shown in FIG. 8, when object 64 (FIG. 7) is closer to point A, the wireless signals transmitted by the base station at point A may be received by the antennas of object 64 at a high efficiency (e.g., high power PA), and the wireless signals transmitted by the base station at point B may be received by the antennas of object 64 at a low efficiency (e.g., low power PB). When object 64 is closer to point B, the wireless signals transmitted by the base station at point B may be received by the antennas of object 64 at a low power PA while the wireless signals transmitted by the base station at point B may be received by the antennas of object 64 at a high power PB. The varying magnitudes of PA and PB as object 64 may be emulated using channel emulators 38 and control unit 40 of test system 22 to replicate the behavior of DUT 10 as DUT 10 moves from point A to point B.

The position of device 64 is represented by distance X on the horizontal axis of the graph of FIG. 8. There may be a location along dimension X where PA is approximately equal to PB. The region surrounding this location may be referred to as the handover region (see, e.g., FIG. 8). The handover region represents the region in which PA transitions from being greater than PB to being less than PB.

Figure 9:
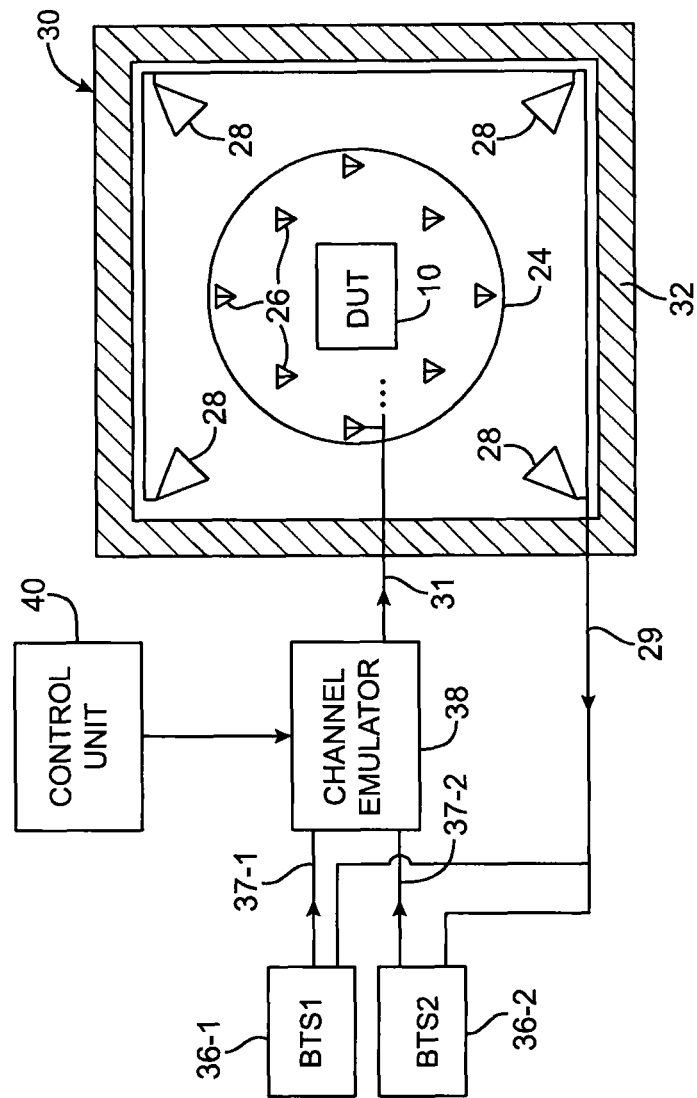
FIG. 9 is a diagram showing an illustrative system with multiple base stations that can be used to test a multi-antenna device in accordance with an embodiment of the present invention.

A test system of the type shown in FIG. 9 may be able to handle handover modeling. The system of FIG. 9 may have a first base transceiver station (BTS1) 36-1 and a second base transceiver station (BTS2) 36-2. Transceivers BTS1 and BTS2 may transmit data onto signal lines 37-1 and 37-2, respectively. Signal lines 37-1 and 37-2 may be connected to two input terminals of channel emulator 38. Channel emulator 38 may have output lines 31 that feed each of OTA antennas 26 in spherical antenna structure 24. To test handover operations, the power that is placed on line 37-1 (e.g., power Pa of FIG. 8) may be adjusted relative to the power that is placed on line 37-2 (e.g., power PB of FIG. 8). Using OTA antennas 26, the spatial characteristics of the radio-frequency signals on lines 37-1 and 37-2 can be controlled.

The RF signals transmitted by OTA antennas 26 may contain contributions from BTS1 and BTS2. Channel emulator 38 may be tuned to adjust the wireless signals that are being transmitted by the OTA antennas. Channel emulator 38 may be controlled by control unit 40. Using control unit 40, channel emulator 38 may be adjusted to emulate interference (e.g., interference of the two sets of data sent by BTS1 and BTS2), handover mechanisms, full system link level performance evaluations, radio resource control mechanisms, power control, coordinated interference strategies, etc. A testing system configured in this way may be used for testing cellular networks, wireless local area networks (WLAN), Bluetooth® links, etc.

Measurements may be taken on signal line 29 to evaluate the impact that the various effects (e.g., signal interference, multipath propagation, handover mechanisms, etc.) have on a wireless electronic device. If desired, passive measurements may be made to evaluate the impact of various interference patterns.

Figure 10:
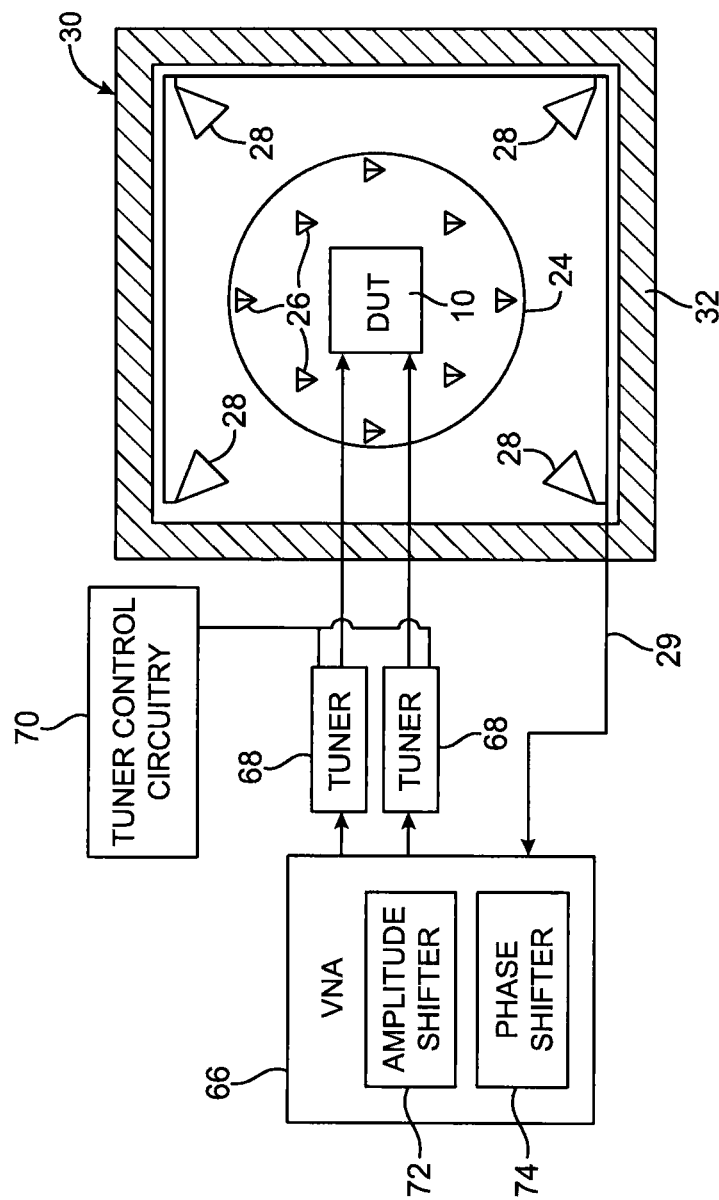
FIG. 10 is a diagram showing how equipment that can tune impedances, and alter signal phases and amplitudes can be used in testing a multi-antenna device in accordance with an embodiment of the present invention.

As shown in FIG. 10, a vector network analyzer (VNA) 66 may be used to test DUT 10. VNA 66 is test equipment that can be used as a source (e.g., a signal generator) or a receiver (e.g., an output signal analyzer). VNA 66 may be specifically calibrated to measure RF signals. For example, during transmission measurements, VNA 66 may have two output ports that generate radio-frequency signals. Tuners such as tuners 68 (e.g., load-pull tuners) may be connected to the two output ports. Tuners 28 may be coupled to the paths between VNA 66 and DUT 10. Tuners 68 may be used to vary the impedances of the antenna ports associated with the antennas of DUT 10 during signal transmission. The impedances may be varied to values other than 50 ohms. If desired, VNA 66 may incorporate circuitry such as amplitude shifter 72 and phase shifter 74 for varying the phase and amplitude of the radio-frequency signals. Tuners 68 may be controlled by tuner control circuitry 70.

DUT 10 may transmit the RF signals that are provide by VNA 66. The transmitted signals and the corresponding radiation pattern may be received and detected by receiving antennas 28. Receiving antennas 28 may be connected to signal line 29. Signal line 29 may be connected to an input port of VNA 66. VNA 66 may be able measure the input-output characteristics of the transmitted signals to evaluate performance parameters of the DUT antennas such as gain, compression characteristics, saturated power, efficiency, or linearity at the various impedances, amplitude and/or phase shifts, etc. If desired, VNA 66 may also be configured to measure the receiving capabilities of DUT 10.

Testing DUT 10 in this way need not involve channel emulator 38. VNA 66, tuners 68, and tuner control circuitry 70 may all be located outside of chamber 30.

The antenna design of DUT 10 may be optimized based on the test results gathered with the test system. It may be of interest to investigate how antenna orientation, antenna polarization, the number of antennas, and the distance between the antennas affect performance metrics. During test measurements, channel emulators 38 may shift the phases and/or amplitudes of the RF signals to determine the impact of interference patterns. Protocol-compliant tests may also be performed. The testing system may be used to test single-input and multiple-output (SIMO) OTA systems, multiple-input and single-output (MISO) OTA systems, single-input and single-output (SISO) OTA systems, frequency modulation (FM) OTA systems, cellular time-division-duplex (TDD) systems, cellular frequency-division-duplex (FDD) systems, etc.

Figure 11:
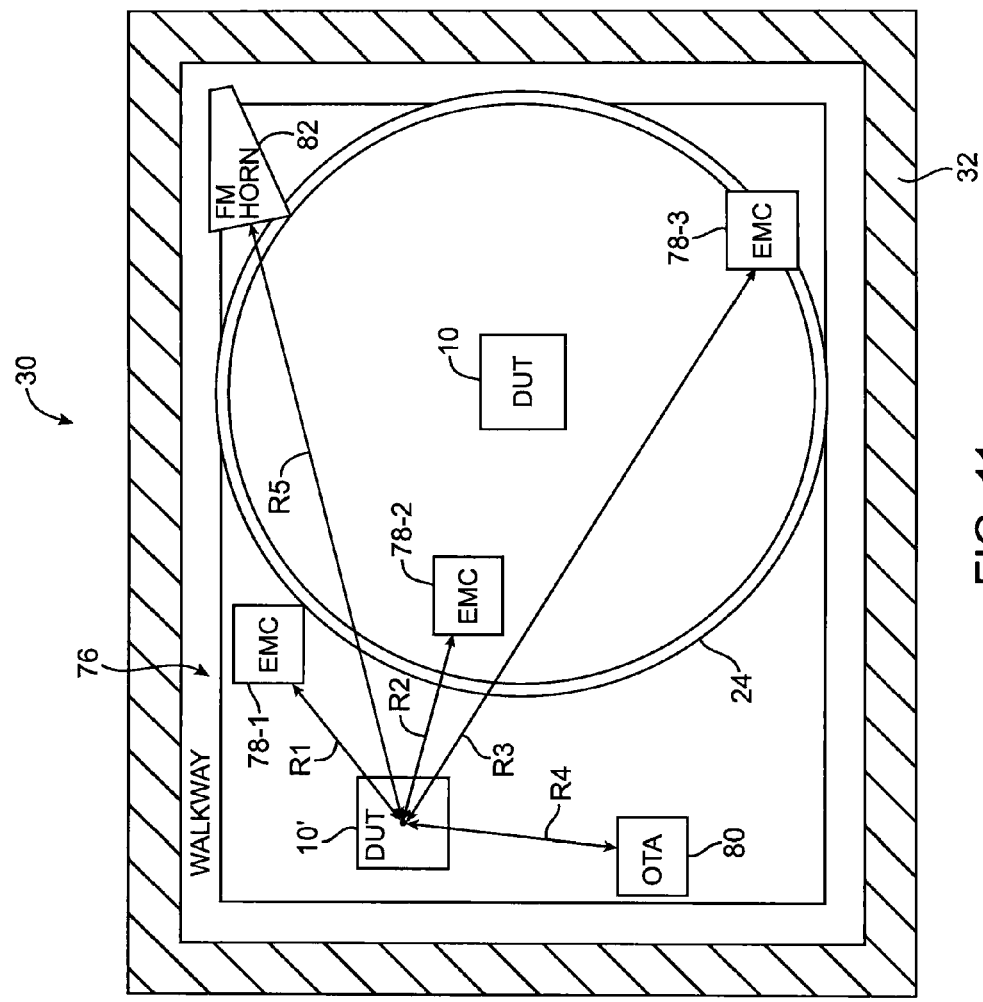
FIG. 11 is a cross sectional top view of an illustrative test chamber in accordance with an embodiment of the present invention.

The DUT may not be located at the center of antenna mounting structure 24, as shown in FIG. 11. For example, a DUT such as DUT 10' may be located within test chamber 30 and may be located outside antenna mounting structure 24. DUT 10' may be attached to a DUT support structure of the type described in connection with FIG. 6. DUT 10' may be tested outside antenna mounting structure 24. If desired, multiple DUTs may be tested in test chamber 30. For example, DUT 10 and DUT 10' may be tested one at a time (e.g., in series). A DUT such as DUT 10 that is positioned at the center of antenna mounting structure 24 may be powered off during testing of peripheral DUT 10'. The OTA antennas attached to antenna mounting structure 24 may be powered off during testing of DUT 10'.

There may be multiple antennas positioned throughout test chamber 30 that transmit and receive wireless signals to and from DUT 10' during testing of DUT 10'. For example, there may be electromagnetic-compatible (EMC) antennas such as EMC antennas 78-1, 78-2 and 78-3 placed inside test chamber 30. EMC antennas 78-1, 78-2, and 78-3 may be positioned away from DUT 10' at radii of R1, R2, and R3, respectively. There may also be OTA antennas and frequency modulation (FM) antennas such as OTA antenna 80 and FM antenna 82 placed inside test chamber 30. OTA antenna 80 may be positioned at a radius of R4 away from DUT 10'. FM antenna may be positioned at a radius of R5 away from DUT 10'. The magnitudes of R1, R2, R3, R4, and R5 may all be different. FM antenna may be a horn antenna. If desired, any suitable type of antenna or any number of any suitable type of antenna may be positioned at any desired location and distance from DUT 10'.

The antennas (e.g., EMC antennas, OTA antennas, and FM horn antennas) that are used to test DUT 10' may be mounted on any suitable type of antenna positioning structure. The antenna positioning structure may be a rod or any suitable type of platform to which antennas may be attached. As shown in FIG. 11, test chamber 30 may have a walkway such as walkway 76. Walkway 76 may allow a user to walk about within the test chamber and may allow the user physical access to the various devices within test chamber 30.

Figure 12:
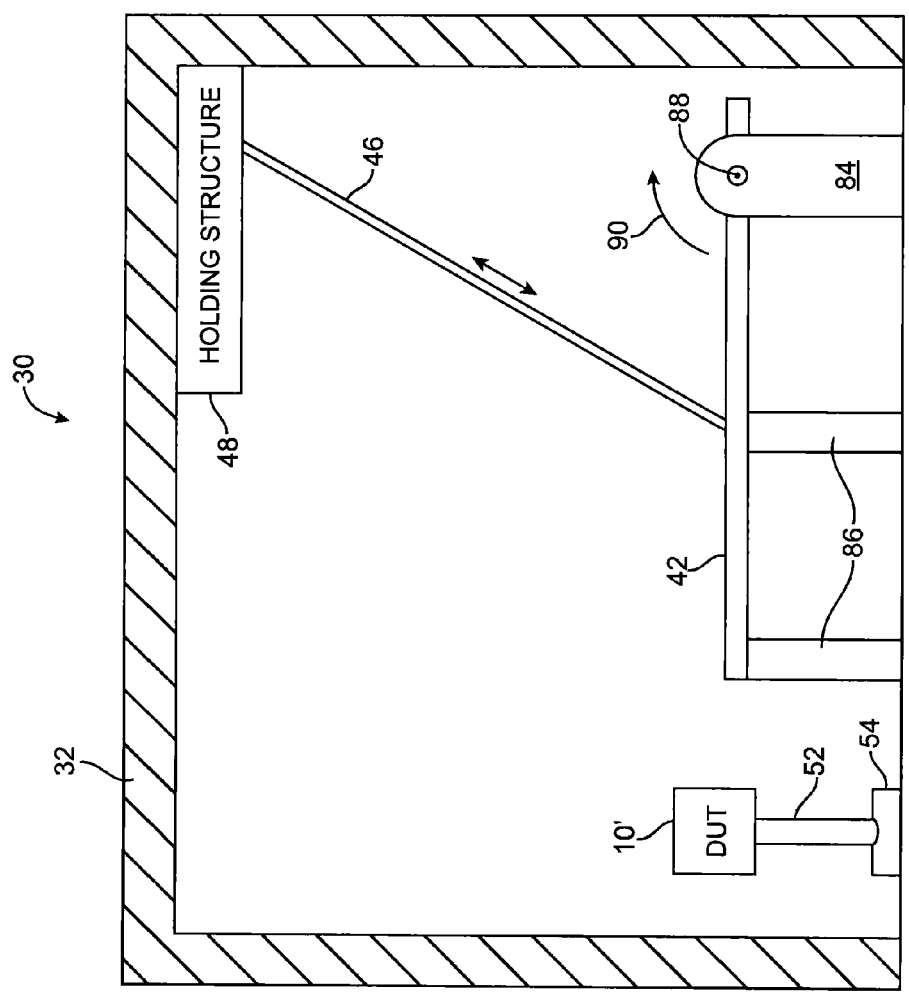
FIGS. 12 and 13 are cross sectional side views of an illustrative test chamber with a hinge structure in accordance with an embodiment of the present invention.
Figure 13:
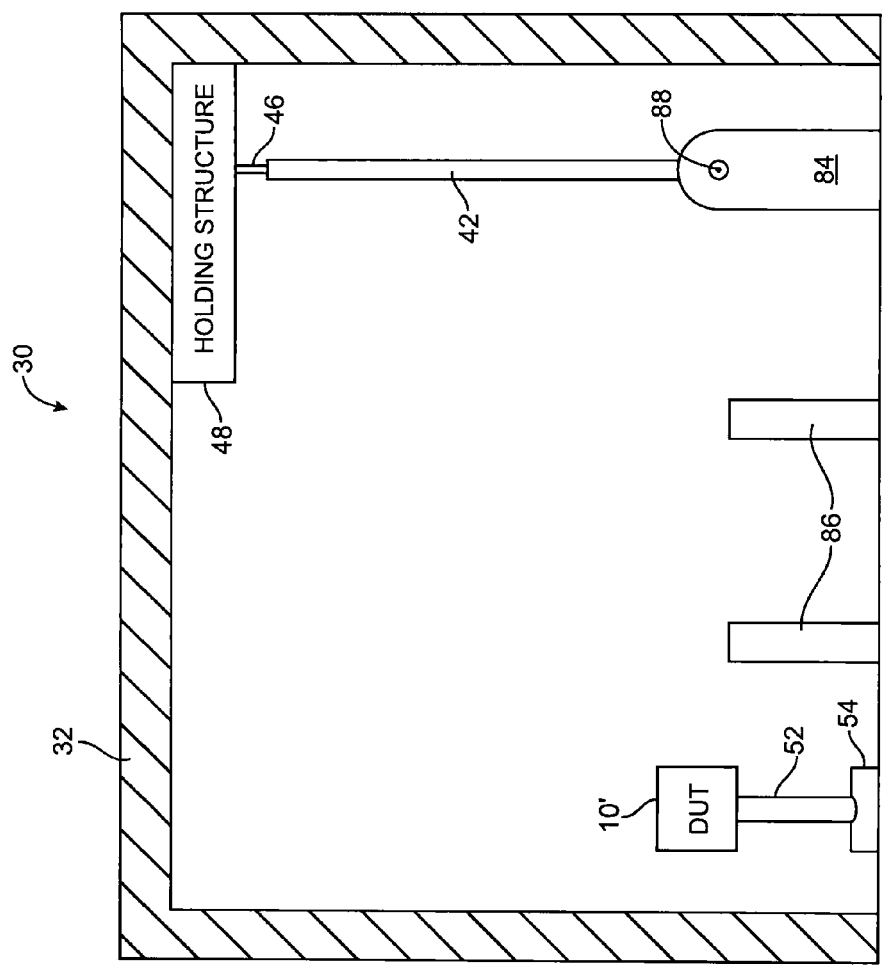

FIGS. 12 and 13 show cross-sectional side views of the test chamber of FIG. 11. As described previously, DUT 10' may be supported by the antenna supporting structure of FIG. 6. The antenna supporting structure may include rod 52 that supports DUT 10'. Rod 52 may be attached to base 54. As shown in FIG. 12, a ring-shaped antenna mounting structure 42 may be located within test chamber 30. Antenna mounting structure 42 may be supported by support members such as support members 86 and may be supported by a hinge structure such as hinge structure 84.

During testing of DUT 10', antenna mounting structure 42 may be rotated away from DUT 10'. Hinge structure 84 allows antenna mounting structure 42 to pivot about pivot (hinge) axis 88. Antenna mounting structure 42 may, for example, be rotated (pivoted) upwards in direction 90 until antenna mounting structure is in an upright position (as shown in FIG. 13). Holding structure 48 may be located inside test chamber 30. Holding structure 48 may be attached to the ceiling of test chamber 30. Holding structure 48 may be attached to a wall of test chamber 30, if desired. Holding structure 48 may control the position of a wire, cable, rigid member, or other retractable support structure 46. Support structure 46 may be attached between antenna mounting structure 42 and holding structure 48. Holding structure 48 may have pulleys, motors, and other mechanical equipment that can retract support structure 46. Retracting support structure 46 may help rotate antenna mounting structure 42 into the upright position.

To reduce undesired scatter and reflections, the interior surfaces in the test chambers may be covered with foam absorbers or other radio-insensitive coatings. Surfaces that can potentially scatter radio-frequency signals include surfaces of antenna mounting structures, holding structures, chamber walls, etc. To increase signal quality and to achieve maximum radio insensitivity, all or substantially all of the surfaces within the test chamber may be covered with radio-insensitive coverings (e.g., more than 70%, more than 80%, or more than 90%).

The foregoing is merely illustrative of the principles of this invention and various modifications can be made by those skilled in the art without departing from the scope and spirit of the invention.

What is claimed is:

1. A wireless test system, comprising:
   a test chamber;
   a plurality of test antennas within the test chamber;
   a plurality of retractable ring-shaped antenna mounting structures on which the test antennas are mounted, wherein the plurality of retractable ring-shaped antenna mounting structures share a common concentric axis, and wherein the plurality of retractable ring-shaped antenna mounting structures comprises ring-shaped antenna mounting structures of different sizes that form a spherical antenna mounting structure; and
   radio-frequency circuitry coupled to the array of test antennas.

2. The wireless test system defined in claim 1 wherein the radio-frequency circuitry includes at least one channel emulator having a plurality of ports each of which is coupled to a respective one of the test antennas.

3. The wireless test system defined in claim 1 further comprising positioning equipment that moves the plurality of retractable ring-shaped antenna mounting structures.

4. The wireless test system defined in claim 3 further comprising hollow members that couple the retractable ring-shaped antenna mounting structures to the positioning equipment.

5. The wireless test system defined in claim 1 wherein the test system comprises a fixed device-under-test mounting structure positioned at least partly within the plurality of test antennas.

6. The wireless test system defined in claim 1 further comprising positioning equipment that moves the plurality of retractable ring-shaped antenna mounting structures within the test chamber.

7. The wireless test system defined in claim 6 wherein the plurality of test antennas includes at least 20 antennas.

8. The wireless test system defined in claim 1 further comprising:
a channel emulator;
at least one path that couples the channel emulator to each of the test antennas in the plurality of test antennas; and
a plurality of receiving antennas located within the test chamber and outside of the plurality of retractable ring-shaped antenna mounting structures.

9. The wireless test system defined in claim 1 wherein the plurality of test antennas includes at least 20 test antennas.

10. The wireless test system defined in claim 9 further comprising a plurality of controllable tuners that adjust antenna port impedances during test measurements.

11. The wireless test system defined in claim 1 wherein the test antennas comprise horn antennas.

12. The wireless test system defined in claim 1 wherein the radio-frequency circuitry is configured to adjust radio-frequency signal amplitudes for radio-frequency signals transmitted through the test antennas.

13. The wireless test system defined in claim 1 wherein the radio-frequency circuitry is configured to adjust radio-frequency signal phases for radio-frequency signals transmitted through the test antennas.

14. The wireless test system defined in claim 1 further comprising:
a channel emulator having an input; and
at least one path that conveys signals to the input of the channel emulator from the test antennas.

15. A test system, comprising:
a first test chamber having a first plurality of transmitting test antennas surrounding a device under test and having at least a first receiving antenna, wherein the first plurality of transmitting test antenna are configured to transmit radio-frequency test signals to the device under test, wherein the at least first receiving antenna is configured to receive corresponding radio-frequency test signals from the device under test, the first plurality of transmitting test antennas are positioned at first distances from the device under test, the first receiving antenna is positioned at a second distance from the device under test that is greater than the first distances, the first test chamber comprises a plurality of retractable ring-shaped antenna mounting structures on which the first plurality of transmitting test antennas are mounted, the plurality of retractable ring-shaped antenna mounting structures share a common concentric axis, and the plurality of retractable ring-shaped antenna mounting structures have different sizes that form a spherical antenna mounting structure; and
a second test chamber having a second plurality of transmitting test antennas and having at least a second receiving antenna, wherein signals received by the first receiving antenna are conveyed to the second test chamber and wherein signals received by the second receiving antenna are conveyed to the first test chamber.

16. The test system defined in claim 15 further comprising:
a first channel emulator that conveys signals from the first receiving antenna to the second plurality of test antennas.

17. The test system defined in claim 16 further comprising a second channel emulator that conveys signals from the second receiving antenna to the first plurality of test antennas.

18. A method of testing a multi-antenna device under test that has a plurality of device antennas and multi-antenna wireless equipment that has a plurality of wireless equipment antennas using a test system that has first and second channel emulators and first and second test chambers, wherein the first and second test chambers include respective first and second pluralities of test antennas arranged in respective three-dimensional arrays and include respective first and second pluralities of receiving antennas, comprising:
with the first plurality of receiving antennas, receiving radio-frequency signals from each of the plurality of wireless equipment antennas in the first test chamber;
with the first channel emulator, conveying the received radio-frequency signals from the first plurality of receiving antennas to the second plurality of test antennas;
with the second plurality of test antennas, transmitting radio-frequency signals from the first channel emulator to each of the antennas of the multi-antenna device under test, wherein the second plurality of test antenna are mounted on a plurality of retractable ring-shaped antenna mounting structures that share a common concentric axis and have different sizes that form a spherical antenna mounting structure; and
with positioning structures, adjusting a position for at least some of the retractable ring-shaped antenna mounting structures with respect to one another.

19. The method defined in claim 18 further comprising:
with the second plurality of receiving antennas, receiving radio-frequency signals from each of the plurality of device antennas in the second test chamber;
with the second channel emulator, conveying the received radio-frequency signals from the second plurality of receiving antennas to the first plurality of test antennas; and
with the first plurality of test antennas, transmitting radio-frequency signals from the second channel emulator to each of the plurality of wireless equipment antennas.

20. The method defined in claim 19 wherein the wireless equipment antennas comprise base station antennas and wherein the device antennas comprises handheld electronic device antennas, wherein transmitting the radio-frequency signals from the first channel emulator to each of the antennas of the multi-antenna device under test comprises transmitting radio-frequency signals to the handheld electronic device antennas, and wherein transmitting radio-frequency signals from the second channel emulator to each of the plurality of wireless equipment antennas comprises transmitting radio-frequency signals to the base station antennas.

* * * * *